(12) United States Patent
Jung

(10) Patent No.: US 7,154,143 B2
(45) Date of Patent: Dec. 26, 2006

(54) NON-VOLATILE MEMORY DEVICES AND METHODS OF FABRICATING THE SAME

(75) Inventor: Jin Hyo Jung, Bucheon (KR)

(73) Assignee: Dongbu Electronics Co., Ltd., Seoul (KR)

(*) Notice: Subject to any disclaimer, the term of this patent is extended or adjusted under 35 U.S.C. 154(b) by 0 days.

(21) Appl. No.: 10/981,164

(22) Filed: Nov. 4, 2004

(65) Prior Publication Data

US 2005/0093054 A1 May 5, 2005

(30) Foreign Application Priority Data

Nov. 5, 2003 (KR) .................. 10-2003-0077923

(51) Int. Cl.
*H01L 29/792* (2006.01)

(52) U.S. Cl. ............ 257/324; 257/310; 257/411; 257/E29.309

(58) Field of Classification Search ............ 257/324
See application file for complete search history.

(56) References Cited

U.S. PATENT DOCUMENTS

| | | | |
|---|---|---|---|
| 5,600,166 A | 2/1997 | Clementi et al. | 257/324 |
| 6,413,820 B1 | 7/2002 | Bui | 438/257 |
| 6,674,138 B1* | 1/2004 | Halliyal et al. | 257/411 |
| 2003/0047755 A1* | 3/2003 | Lee et al. | 257/200 |

FOREIGN PATENT DOCUMENTS

| | | |
|---|---|---|
| KR | 10-2003-0002298 | 1/2003 |
| KR | 10-2003-0081898 | 10/2003 |

* cited by examiner

*Primary Examiner*—Tu-Tu Ho
(74) *Attorney, Agent, or Firm*—Andrew D. Fortney

(57) ABSTRACT

Non-volatile memory devices and methods of fabricating the same are disclosed. A disclosed non-volatile memory device includes: a tunnel oxide layer formed on a semiconductor substrate and having an energy bandgap; a storage oxide layer formed on the tunnel oxide layer and having an energy bandgap which is smaller than the energy bandgap of the tunnel oxide layer; a block oxide layer formed on the storage oxide layer and having an energy bandgap greater than the energy bandgap of the storage oxide layer; and a gate formed on the block oxide layer.

25 Claims, 10 Drawing Sheets

US 7,154,143 B2

NON-VOLATILE MEMORY DEVICES AND METHODS OF FABRICATING THE SAME

FIELD OF THE DISCLOSURE

The present disclosure relates generally to memory devices and, more particularly, to non-volatile memory devices and methods of fabricating the same.

BACKGROUND

Non-volatile memory related technologies have been described in U.S. Pat. Nos. 5,600,166 and 6,413,820.

Conventionally, non-volatile memory devices are classified as either a floating gate device or a silicon oxide-nitride-oxide silicon (SONOS) device.

FIG. 1 is a cross sectional view illustrating a conventional floating gate device structure. FIG. 2 is a cross sectional view illustrating a conventional SONOS device structure.

The floating gate device shown in FIG. 1 includes a silicon substrate 10 having a source 11 and a drain 12, a tunnel oxide layer 13, a polysilicon floating gate 14, an oxide-nitride-oxide (ONO) layer 15, and a control gate 16 sequentially formed on the silicon substrate 10 between the source 11 and the drain 12.

In this type of the floating gate device, the voltage of the memory cell is set to a first level by capturing electrons within an electric charge well using a hot carrier injection technique during a programming operation, and the voltage of the memory cell is set to a second, lower level by releasing the electrons blocked in the electric charge well out to a P-type silicon substrate using a direct tunneling or F-N tunneling technique during an erasing operation.

The floating gate device has a fast programming speed, superior retention characteristics, and a wide threshold voltage (Vt) window. As a result, it has been used for most conventional non-volatile memories.

However, such a floating gate device is disadvantageous in that the fabrication process of the floating gate is very complicated, and particularly, exhibits scaling limits due to high electric charge loss caused by coupling between adjacent memory cells.

On the other hand, the conventional SNOS device shown in FIG. 2 includes a P-type silicon substrate 20 having a source 21 and a drain 22, an ONO layer 23 formed by sequentially depositing a tunnel oxide layer, a trap nitride layer, and a block oxide layer on the substrate 20, and a gate 24 formed on the ONO layer 23.

In such a SONOS device, the voltage of the memory cell is set at a first level by trapping electrons in a trap site which exists in the trap nitride of the ONO layer 23 using the direct tunneling or F-N tunneling technique during the programming operation, and the voltage of the memory cell is set at a second, lower level by tunneling the electrons out of the trap site to the P-type substrate using the F-N tunneling, the direct tunneling, or the trap assisted tunneling technique during the erasing operation.

The SONOS device can be scaled as in the logic device, can be fabricated in simple fabrication, and has a high immunity against local defects and cosmic rays. However, the SONOS device has a bad retention characteristic, a slow programming speed, and a narrow threshold voltage window in comparison with the floating gate device.

DETAILED DESCRIPTION

Figure 1:
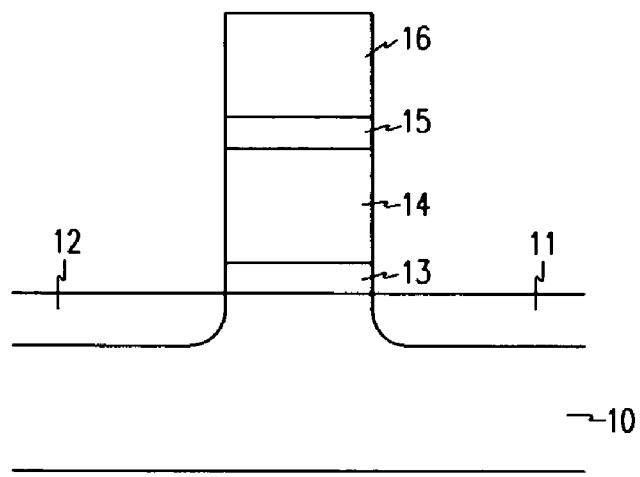
FIG. 1 is a cross sectional view illustrating a conventional floating gate device.
Figure 2:
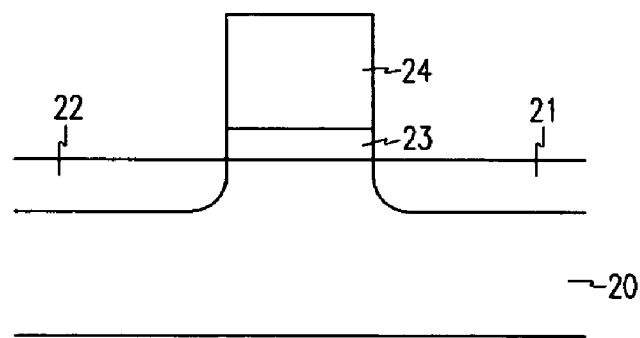
FIG. 2 is a cross sectional view illustrating a conventional SONOS device.
Figure 3:
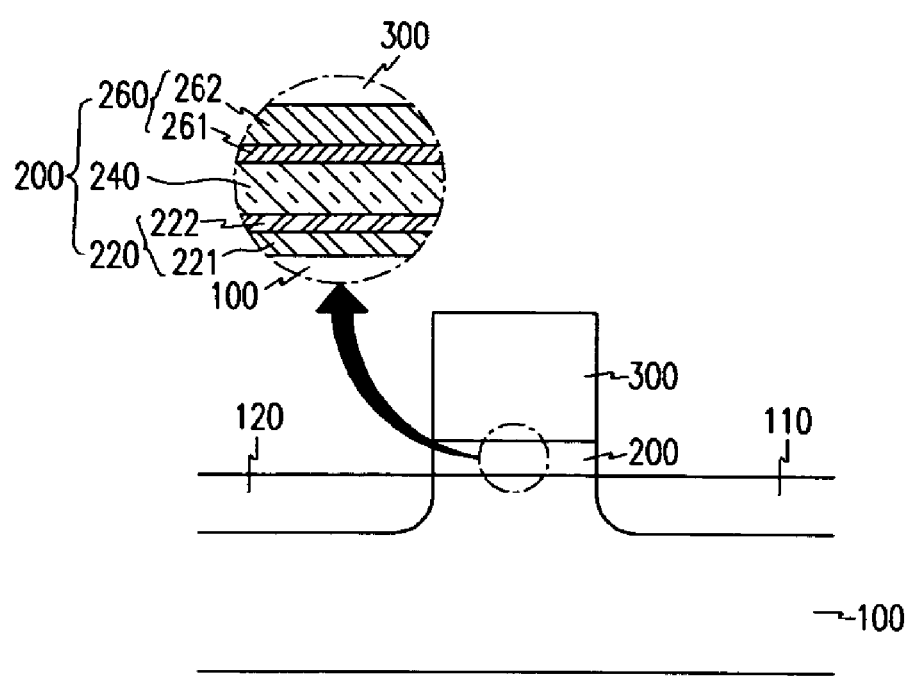
FIG. 3 is a cross sectional view illustrating an example non-volatile memory device constructed in accordance with the teachings of the present invention.

FIG. 3 is a cross sectional view illustrating an example non-volatile memory device constructed in accordance with the teachings of the present invention. The example non-volatile memory device of FIG. 3 includes a semiconductor substrate 100 having a source 110 and drain 120, and a gate dielectric layer 200 and a gate 300 sequentially formed on the semiconductor substrate 100 between the source 110 and the drain 120.

The gate dielectric layer 200 has a triply layered structure formed by sequentially depositing a tunnel oxide layer 220, a storage oxide layer 240 having a low trap density, and a block oxide layer 260. As shown in FIG. 3, the tunnel oxide layer 220 can include sequentially deposited first and second tunnel oxide layers 221 and 222, and the block oxide layer 260 can include sequentially deposited first and second block oxide layers 261 and 262. In other words, the gate oxide layer 200 can be a three layered structure. Alternatively, the gate oxide layer 200 may be formed as a fourfold structure by forming either the tunnel oxide layer 220 or the block oxide layer 260 as a dual layered structure. Alternatively, the gate oxide layer 200 can be formed as a fivefold structure by forming both the tunnel oxide layer 220 and the block oxide layer 260 as dual layers.

The storage oxide layer 240 (which is formed on the tunnel oxide layer 220) has an energy bandgap smaller than that of the tunnel oxide layer 220. The block oxide layer 260 (which s formed on the storage oxide layer 240) has an energy bandgap greater than that of the storage oxide layer 240.

In order to satisfy the energy bandgap relationship of the tunnel oxide layer 220, the storage oxide layer 240 and the block oxide layer 260, the oxide materials for those layers are selected as follows. The tunnel oxide layer 220 can be made from any of $SiO_2$, $Al_2O_3$ and $Y_2O_3$. The storage oxide layer 240, which is required to have a high permittivity and a low trap density, can be made from any of $HfO_2$, $ZrO_2$, $BaZrO_2$, $BaTiO_3$, $Ta_2O_5$, $CaO$, $SrO$, $BaO$, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, and $Lu_2O_3$. The block oxide layer 260 can be made from any of $SiO_2$, $Al_2O_3$ and $Y_2O_3$ that have a large energy bandgap as in the tunnel oxide layer 220.

If the tunnel oxide layer 220 is formed as a dual layered structure including the first and second tunnel oxide layers 221 and 222, the first tunnel oxide layer 221 should have an energy bandgap which is greater than the energy bandgap of the storage oxide layer 240 and less than the energy bandgap of the second oxide layer 222. In order to satisfy this condition, the first oxide layer 221 can be made from any of $HfO_2$, $ZrO_2$, $BaZrO_2$, $BaTiO_3$, $Ta_2O_5$, CaO, SrO, BaO, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, and $Tm_2O_3$, $Yb_2O_3$, $Lu_2O_3$, and the second tunnel oxide layer 222 can be made from any of $SiO_2$, $Al_2O_3$, and $Y_2O_3$.

If the block oxide layer 260 is formed in a dual layered structure including the first and second block oxide layers 261, 262, the second block oxide layer 262 should have an energy bandgap which is greater than the energy bandgap of the storage oxide layer 240 and is less than the energy bandgap of the first block oxide layer 261. In order to satisfy this condition, the first block oxide layer 261 can be made from any of $SiO_2$, $Al_2O_3$ and $Y_2O_3$, and the second oxide layer 262 can be made from any of $HfO_2$, $ZrO_2$, $BaZrO_2$, $BaTiO_3$, $Ta_2O_5$, CaO, SrO, BaO, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, and $Lu_2O_3$.

FIG. 4a to FIG. 4d are energy band diagrams of a preferred example non-volatile memory device, which uses a p-type silicon wafer as the semiconductor substrate, $SiO_2$ as the tunnel oxide layer 220, $Ta_2O_5$ as the storage oxide layer 240, and $Al_2O_3$ as the block oxide layer 260. FIG. 4a to FIG. 4d illustrate the energy band diagrams during a balance state, a programming operation, a retention mode, and an erasing operation, respectively.

Figure 4A:
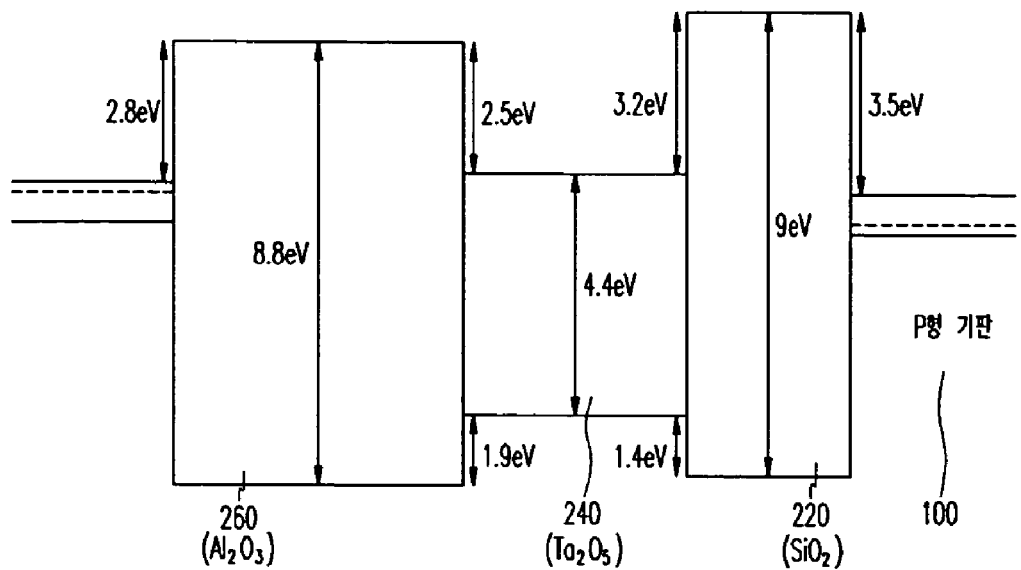
FIG. 4a to FIG. 4d are energy band diagrams of the example non-volatile memory device of FIG. 3 during a balance state, a programming operation, a retention mode, and an erasing operation, respectively.

As shown in FIG. 4a, in the balance state, the difference between the energy levels of the conduction bands of the $SiO_2$ used as the tunnel oxide layer 220 and the $Ta_2O_5$ used as the storage oxide layer 240 becomes 3.2 eV, and the difference between the energy levels of the conduction bands of the $Al_2O_3$ used as the block oxide layer 260 and the $Ta_2O_5$ used as the storage oxide layer 240 becomes 2.5 eV, such that an electric charge well is created by the difference of the energy bands.

Figure 4B:
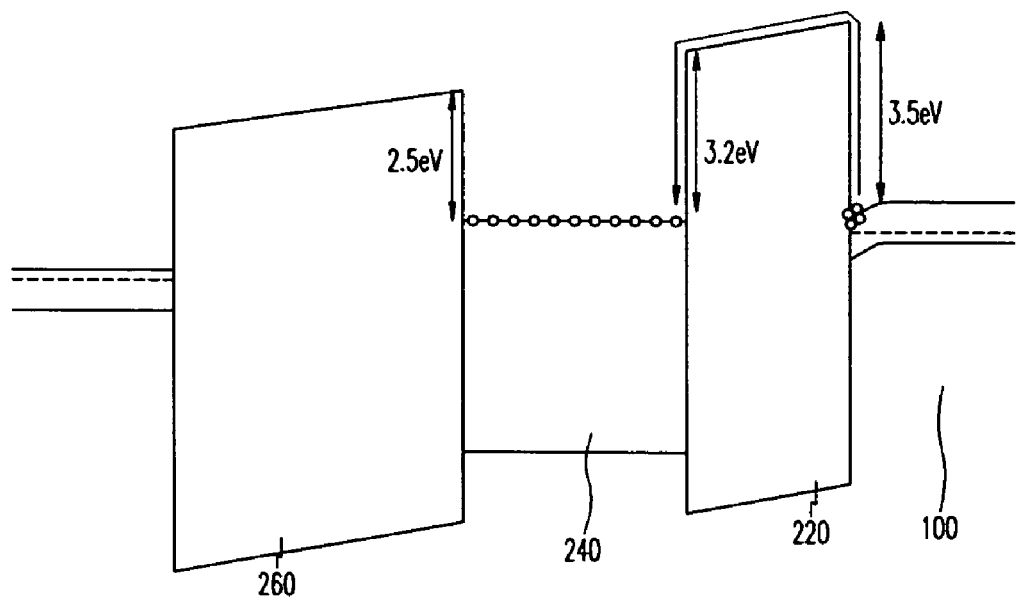

As shown in FIG. 4b, in the programming operation the electric permittivity of $Ta_2O_5$ is 23, which is 5.9 times greater than that of the $SiO_2$ and the permittivity of $Al_2O_3$ is 8.9, which is 2.3 times greater than that of the $SiO_2$, such that most of the voltage applied to the gate is applied to the $SiO_2$. That is, the permittivity of the $Ta_2O_5$ is so great that the voltage drop caused by the $Ta_2O_5$ can be ignored.

If a bias is applied to the gate and drain in the best condition for injecting hot carriers, the electrons formed on the surface of the P-type substrate are accelerated by the drain electric field and obtain an energy which is greater than the electric potential barrier (3.5 eV) of the tunnel oxide layer ($SiO_2$) 220. As a result, the electrons pass the electric potential barrier and are trapped in the electric charge well formed between the block oxide layer 260 and the storage oxide layer 240 and the tunnel oxide layer 220 and the storage oxide layer 240, to thereby increase the threshold voltage.

Some of the electrons trapped in the electric charge well can be trapped within a trap site existing inside the storage oxide layer 240. However, the trap density is so low that only a small portion of the electrons are trapped in the trap site. The remaining electrons are trapped inside the electric charge well. Accordingly, the majority of the increase of the threshold voltage is caused by the electrons trapped in the electric charge well, and the increase of the threshold voltage caused by the electrons trapped in the trap site can, therefore, be ignored.

Figure 4C:
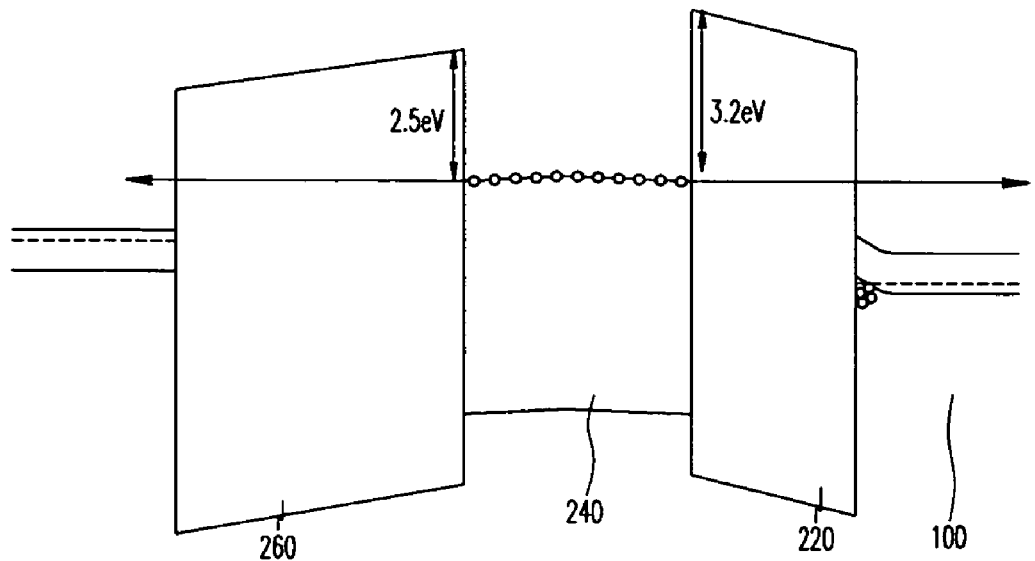

The retention mode will be explained with reference to FIG. 4c, Since, in the illustrated example, the hot carrier injection technique is used during the programming operation, the programming characteristic does not change even when the thickness of the tunnel oxide layer ($SiO_2$) is increased. Therefore, it is possible to thickly form the tunnel oxide layer 220 as in the floating gate device.

The electrons trapped in the electric charge well of the storage oxide layer form an internal electric field, which tunnels the tunnel oxide layer 220 or the block oxide layer 260 such that electrons slip out to the P-type substrate and the gate. This tunneling is inversely proportional to the length of the tunneling in exponential function. Thus, increasing the thicknesses of the tunnel oxide layer 220 and the block oxide layer 260, can dramatically improve the retention characteristic.

Also, the electric potential barrier between the tunnel oxide layer ($SiO_2$) and the storage oxide layer ($Ta_2O_5$) is 3.2 eV, and the electric potential barrier between the block oxide layer ($Al_2O_3$) and the storage oxide layer ($Ta_2O_5$) is 2.5 eV. As a result, electrons cannot jump over the high electric potential barrier, even in a hot or other environment; thereby resulting in an improvement of the retention characteristic.

Figure 4D:
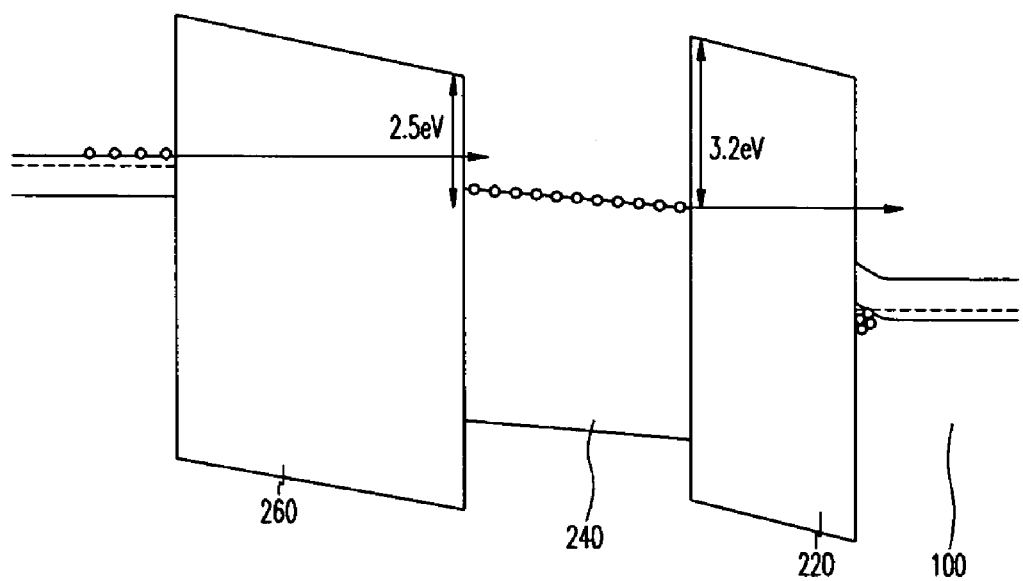

As shown in FIG. 4d, in the erasing state the electrons stored in the electric charge well jump out to the P-type substrate through the tunnel oxide layer 220 using the direct tunneling or F-N tunneling technique. In this example, the electrons existed in the conduction band of the gate electrode (N+ polysilicon gate in this example) tunnel the block oxide layer ($Al_2O_3$) 260 so as to be injected into the conduction band of the storage oxide layer 240. In order to avoid this effect, it is possible to prevent the electrons from being injected into the conduction band of the storage oxide layer 240 from the gate oxide layer by forming the block oxide layer 260 much thicker than the tunnel oxide layer 220.

FIG. 5a to FIG. 5d are energy band diagrams of a second example non-volatile memory device which uses a p-type silicon wafer as the semiconductor substrate, $SiO_2$ as the second tunnel oxide layer 220, $Ta_2O_5$ as the storage oxide layer 240, and $Al_2O_3$ as the block oxide layer 260. FIG. 5a to FIG. 5d illustrate the energy band diagrams during a balance state, a programming operation, a retention mode, and an erasing operation, respectively.

Figure 5A:
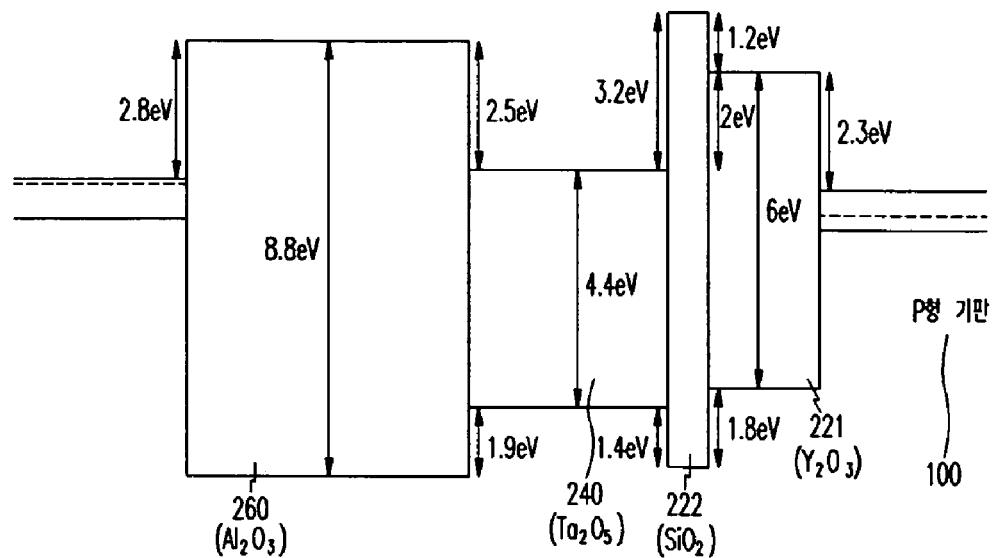
FIG. 5a to FIG. 5d are energy band diagrams of a second example non-volatile memory device during a balance state, a programming operation, a retention mode, and an erasing operation, respectively.

As shown in FIG. 5a, in the balance state the difference between the energy levels of the conduction bands of the $SiO_2$ used as the second tunnel oxide layer 222 and the $Ta_2O_5$ used as the storage oxide layer 240 becomes 3.2 eV. The difference between the energy levels of the conduction bands of the $Al_2O_3$ used as the block oxide layer 260 and the $Ta_2O_5$ used as the storage oxide layer 240 becomes 2.5 eV, such that an electric charge well is created by the difference of the energy bands.

Figure 5B:
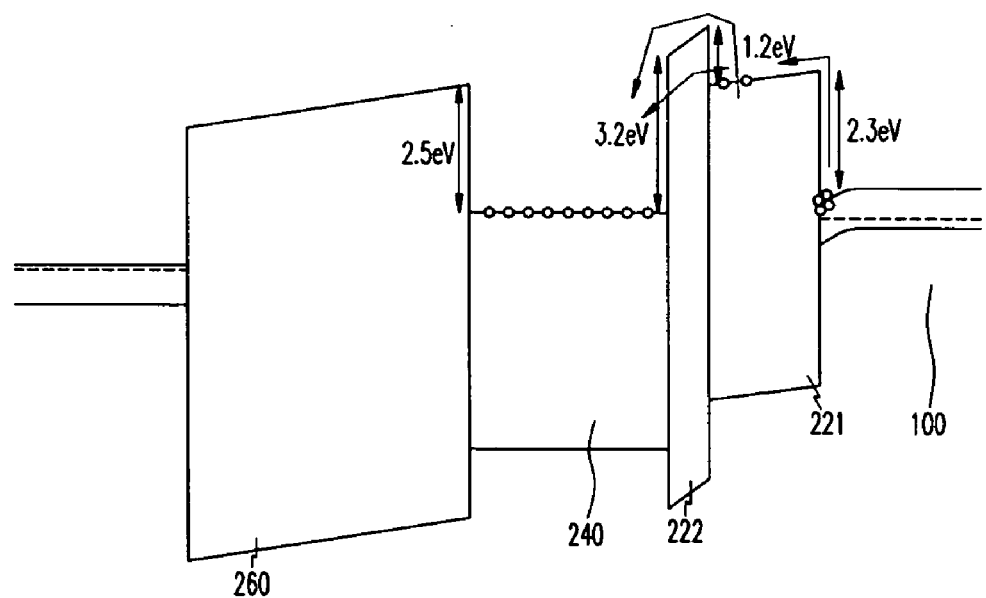

As shown in FIG. 5b, in the programming operation the electric permittivity of $Ta_2O_5$ is 23, which is 5.9 times greater than that of the $SiO_2$, the permittivity of $Al_2O_3$ is 8.9, which is 2.3 times greater than that of the $SiO_2$, and the permittivity of $Y_2O_3$ used as the first tunnel oxide layer 221 is 17, which is 4.4 times greater than that of the $SiO_2$, such that the thickness of the electric oxide layer can be dramatically reduced, resulting in a reduction of the gate voltage.

If a bias is applied to the gate and drain in the best condition for injecting hot carriers, the electrons formed on the surface of the P-type substrate are accelerated by the drain electric field sufficiently to jump the electric potential barrier (2.3 eV) of the first tunnel oxide layer ($Y_2O_3$) 221 and to be injected into the conduction band of the first tunnel oxide layer ($Y_2O_3$) 221. Some of these electrons have sufficient additional energy to be capable of jumping over the electric potential barrier formed between the first and second tunnel oxide layers 221, 222 and to jump the second tunnel oxide layer 222 and be injected into the electric charge well of the storage oxide layer 240. The remained electrons are injected into the electric charge well of the storage oxide layer 240 by the direct tunneling technique. Since the electric potential barrier of the first tunnel oxide layer 221 is lower than the electric potential barrier of the tunnel oxide layer of the previous example (i.e., a tunnel oxide layer using only $SiO_2$) by as much as 1.2 eV, the injection efficiency is improved and the programming speed is enhanced.

Some of the electrons trapped in the electric charge well can be trapped within a trap site existing inside the storage oxide layer 240. However, since the trap density is so low, only a small portion of the electrons are trapped in the trap site. The remaining electrons are trapped inside the electric charge well. Accordingly, the increase of the threshold voltage is primarily caused by the electrons trapped in the electric charge well, and the increase of the threshold voltage caused by the electrons trapped in the trap site can be ignored.

Figure 5C:
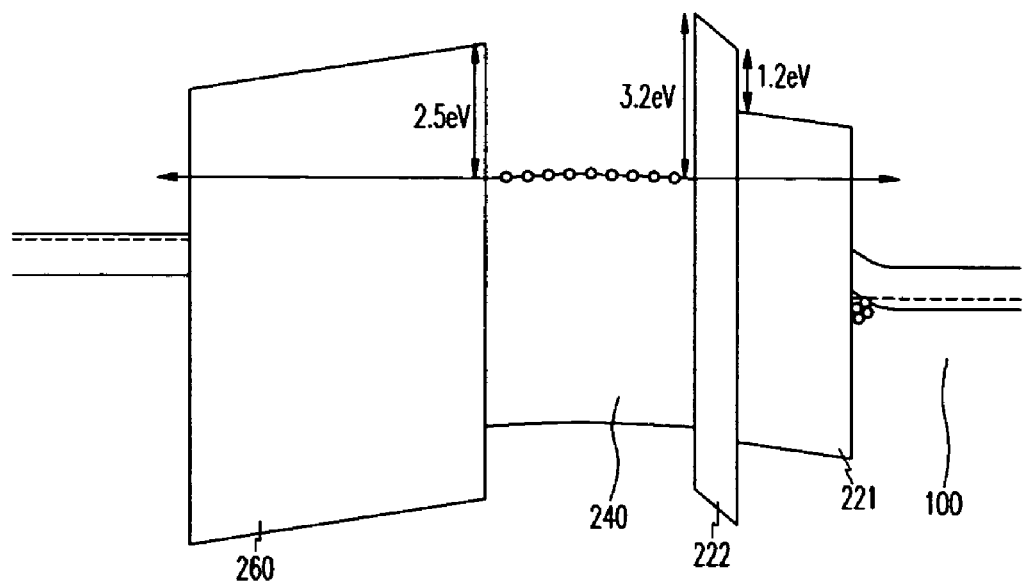

The retention mode will be explained with reference to FIG. 5c. Since, in the illustrated example, the hot carrier injection technique is used during the programming operation, the programming characteristic does not change even when the thickness of the first tunnel oxide layer ($Y_2O_3$) is increased. Consequently, it is possible to thickly form the first tunnel oxide layer as in the floating gate device.

The electrons trapped in the electric charge well of the storage oxide layer 240 form an internal electric field, which tunnels the first tunnel oxide layer 221 and the second tunnel oxide layer 222, or the block oxide layer 260 such that the electrons slip out to the P-type substrate or the gate. The amount of tunneling is inversely proportional to the length of the tunneling in exponential function. Therefore, increasing the thicknesses of the tunnel oxide layer 221, 222 and the block oxide layer 260 can dramatically improve the retention characteristic.

It is noted that the height of the electric potential barrier formed by the second tunnel oxide layer 222 and the storage oxide layer 240 should be higher than the height of the electric potential barrier formed by the second tunnel oxide layer 222 and the first tunnel oxide layer 221. When this guideline is followed, the whole tunneling length becomes equal to the sum of the thickness of the first tunnel oxide layer 221 and the thickness of the second tunnel oxide layer 222. Thus, a dramatic improvement in the retention characteristic is only achieved when the height of the electric potential barrier formed by the second tunnel oxide layer 222 and the storage oxide layer 240 is higher than the height of the electric potential barrier formed by the second tunnel oxide layer 222 and the first tunnel oxide layer 221.

Also, the electric potential barrier between the second tunnel oxide layer ($SiO_2$) 222 and the storage oxide layer ($Ta_2O_5$) 240 is 3.2 eV, and the electric potential barrier between the block oxide layer ($Al_2O_3$) 260 and the storage oxide layer ($Ta_2O_5$) 240 is 2.5 eV. As a result, the electrons cannot jump the high electric potential barrier, even in a hot or other environment, thereby resulting in an improvement of the retention characteristic.

Figure 5D:
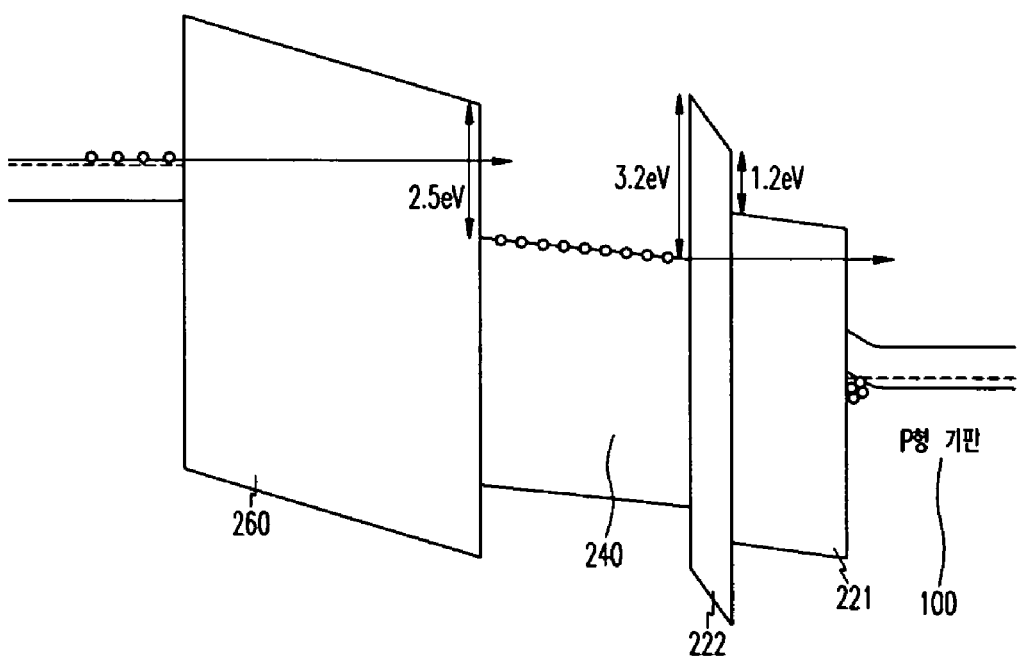

As shown in FIG. 5d, in the erasing state the electrons stored in the electric charge well jump out to the P-type substrate through the tunnel oxide layer 221, 222 using the direct tunneling or F-N tunneling technique. Here, the electrons existing in the conduction band of the gate electrode (N+ polysilicon gate in this example) tunnel the block oxide layer ($Al_2O_3$) 260 and are injected into the conduction band of the storage oxide layer 240. In order to avoid this effect, it is possible to prevent the electrons from being injected into the conduction band of the storage oxide layer 240 from the gate oxide layer by forming the block oxide layer 260 much thicker than the first tunnel oxide layer 221 and the second tunnel oxide layer 222.

FIG. 6a to FIG. 6d are energy band diagrams of a third example non-volatile memory device. The third example non-volatile memory device uses a p-type silicon wafer as the semiconductor substrate, $SiO_2$ as the tunnel oxide layer 220, $Ta_2O_5$ as the storage oxide layer 240, $SiO_2$ as a first block oxide layer 261, $HfO_2$ as a second block oxide layer 262. FIG. 6a to FIG. 6d illustrate the energy band diagrams during a balance state, a programming operation, a retention mode, and an erasing operation, respectively.

Figure 6A:
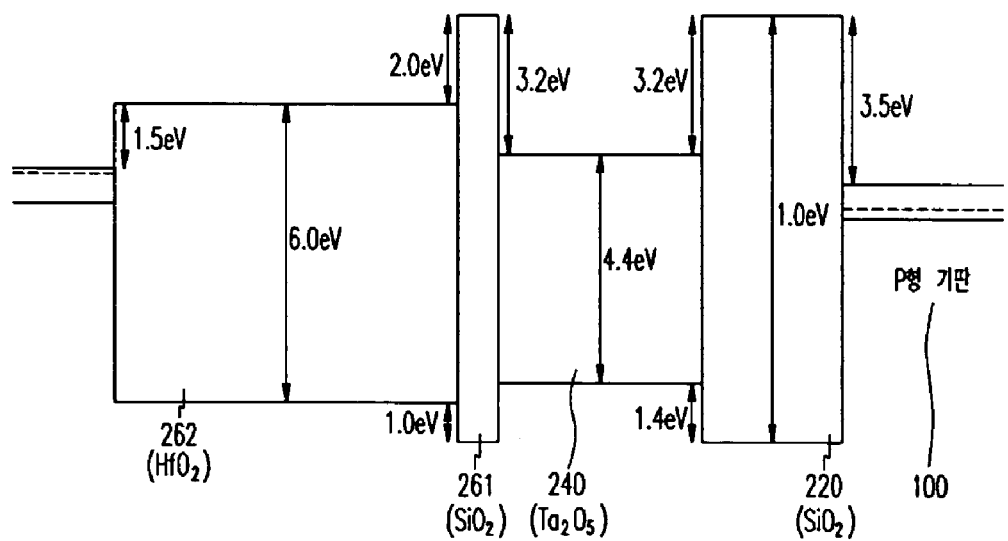
FIG. 6a to FIG. 6d are energy band diagrams of a third example non-volatile memory device during a balance state, a programming operation, a retention mode, and an erasing operation, respectively.

As shown in FIG. 6a, in the balance state the difference between the energy levels of the conduction bands of the $SiO_2$ used as the tunnel oxide layer 220 and the $Ta_2O_5$ used as the storage oxide layer 240 becomes 3.2 eV, and the difference between the energy levels of the conduction bands of the $SiO_2$ used as the first block oxide layer 261 and the $Ta_2O_5$ used as the storage oxide layer 240 becomes 3.2 eV. An electric charge well is created by the difference of the energy bands.

Figure 6B:
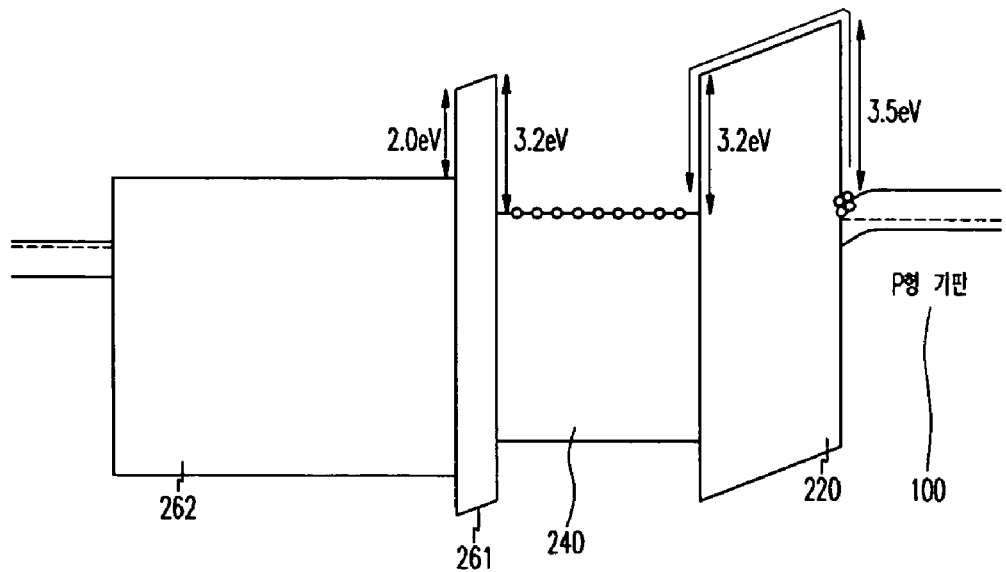

As shown in FIG. 6b, in the programming operation the electric permittivity of $Ta_2O_5$ is 23, which is 5.9 times greater than that of the $SiO_2$ and the permittivity of $HfO_2$ used as the second block oxide layer 262 is 25, which is 6.4 times greater than that of the $SiO_2$, such that most of the voltage applied to the gate is applied to the $SiO_2$. That is, the permittivity of the $Ta_2O_5$ used as the storage oxide layer 240 and the permittivity of the $HfO_2$ used as the second block oxide layer 262 are so great that the voltage drop caused by the $Ta_2O_5$ and $HfO_2$ can be ignored. Also, the thickness of the $SiO_2$ used as the first block oxide layer 261 is thin in comparison with the thickness of the tunnel oxide layer 220 such that most of the gate voltage is applied to the $SiO_2$ tunnel oxide layer 220.

If a bias is applied to the gate and the drain in the best condition for injecting hot carriers, the electrons formed on the surface of the P-type substrate are sufficiently accelerated by the drain electric field so as to obtain energy greater than the electric potential barrier (3.5 eV) of the tunnel oxide layer ($SiO_2$) 220. As a result, these electrons pass the electric potential barrier and are trapped in the electric charge well formed between the block oxide layer 260 and the storage oxide layer 240 and the tunnel oxide layer 220 and the storage oxide layer 240, thereby increasing the threshold voltage.

Some of the electrons blocked in the electric charge well can be trapped within a trap site existing inside the storage oxide layer 240. However, since the trap density is low, only a small portion of the electrons are trapped in the trap site, and the remaining electrons are trapped inside the electric charge well. Accordingly, the increase of the threshold voltage is primarily caused by the electrons trapped in the electric charge well, and the increase of the threshold voltage caused by the electrons trapped in the trap site can be ignored.

Figure 6C:
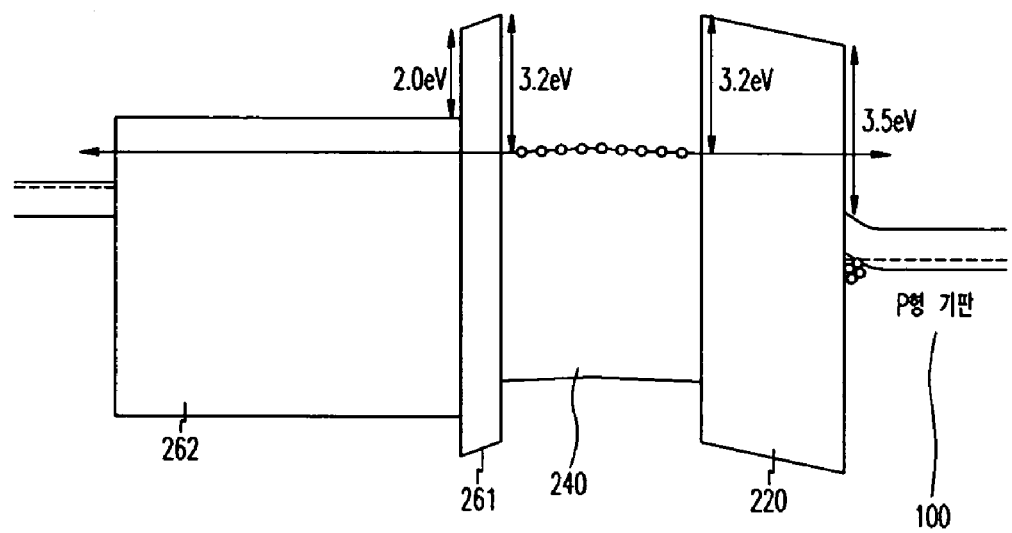

The retention mode will be explained with reference to FIG. 6c. In the illustrated example, since the hot carrier injection technique is used during the programming operation, the programming characteristic does not change even when the thickness of the tunnel oxide layer ($SiO_2$) is increased. Therefore, it is possible to thickly form the tunnel oxide layer as in the floating gate device.

The electrons trapped in the electric charge well of the storage oxide layer form an internal electric field. This internal electric field can cause tunneling of the tunnel oxide layer 220 or the first and second block oxide layers 261, 262 such that the electrons slip out to the P-type substrate and the gate. This tunneling is inversely proportional to the length of the tunneling in exponential function. Thus, it is possible to increase the thicknesses of the tunnel oxide layer 220 and the second block oxide layer 262, to dramatically improve the retention characteristic.

It is noted that the height of the electric potential barrier formed by the first block oxide layer 261 and the storage oxide layer 240 should be higher than the height of the electric potential barrier formed by the first block oxide layer 261 and the second block oxide layer 262. This is because the whole tunneling length becomes equal to the sum of the thicknesses of the first block oxide layer 261 and the second block oxide layer 262. Therefore, the retention characteristic is only dramatically improved when the height of the electric potential barrier formed by the first block oxide layer 261 and the storage oxide layer 240 is higher than the height of the electric potential barrier formed by the second block oxide layer 262 and the first block oxide layer 261.

In a third example, the electric potential barrier between the storage oxide layer ($Ta_2O_5$) 240 and the tunnel oxide layer ($SiO_2$) 220 is 3.2 eV and the electric potential barrier between the first block oxide layer ($SiO_2$) 261 and the second block oxide layer ($HfO_2$) 262 is 2.0 eV. Further, the electric potential barrier between the first block oxide layer 261 and the storage oxide layer 240 is higher than that between the first and second block oxide layers 261, 262 by as much as 1.2 eV. As a result, the entire tunneling length is equal to the sum of the thicknesses of the first and second block oxide layers 261, 262, thereby resulting in an improvement of the retention characteristic.

Also, the electric potential barrier between the tunnel oxide layer ($SiO_2$) 220 and the storage oxide layer ($Ta_2O_5$) 240 is 3.2 eV, and the electric potential barrier between the first block oxide layer ($SiO_2$) 261 and the storage oxide layer ($Ta_2O_5$) 240 is 3.2 eV. Therefore, the electrons cannot jump the high electric potential barrier even in a hot or other environment, which results in improvement of the retention characteristic.

Figure 6D:
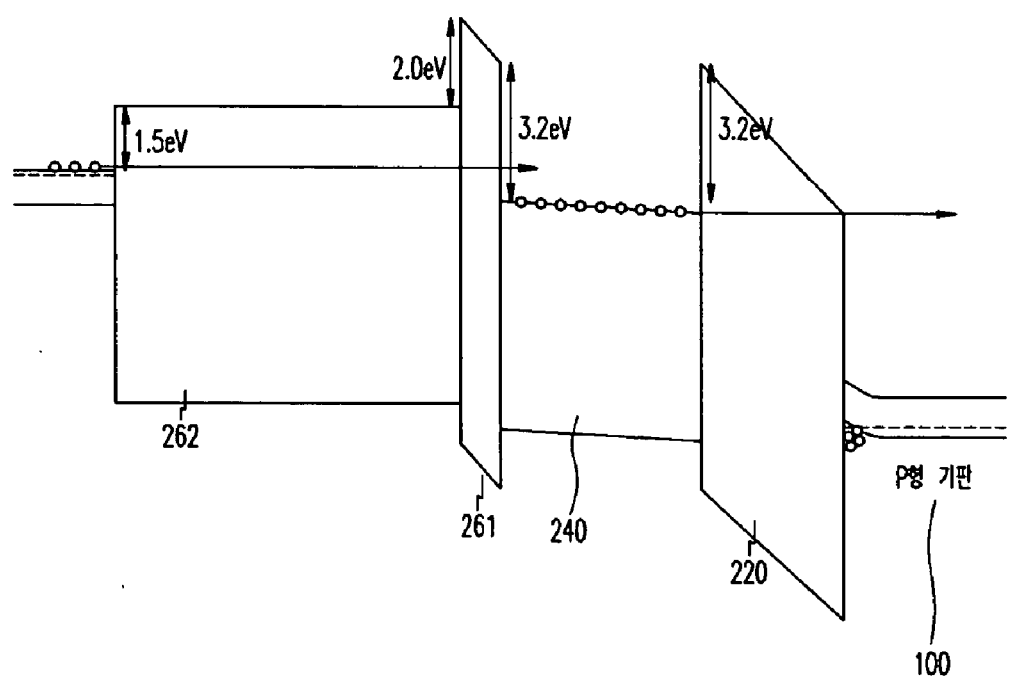

As shown in FIG. 6d, in the erasing state the electrons stored in the electric charge well jump out to the P-type substrate through the tunnel oxide layer 220 using the direct tunneling or F-N tunneling technique. In the illustrated example, since the permittivities of the second block oxide layer 262 and the storage oxide layer 240 are greater than that of the tunnel oxide layer 220, the voltage drop caused by the second block oxide layer 262 and the storage layer 240 can be ignored. Also, the first block oxide layer 261 is thinner than the tunnel oxide layer 220 such that most of the gate voltage is applied to the tunnel oxide layer 220.

In the illustrated example, the electrons existing in the conduction band of the gate electrode (N+ polysilicon gate in this example) may tunnel through the second block oxide layer ($HfO_2$) 262 and be injected into the conduction band of the storage oxide layer 240. In order to avoid this effect, it is possible to prevent the electrons from being injected into the conduction band of the storage oxide layer 240 from the gate oxide layer by forming the second block oxide layer 261 much thicker than the tunnel oxide layer 222. Also, since the increased thickness of the second block oxide layer 262 has little influence on the electric field induced in the tunnel oxide layer 222, the erasing characteristic is not affected.

FIG. 7a to FIG. 7d are energy band diagrams of a fourth example non-volatile memory device. The fourth example device uses a p-type silicon wafer as the semiconductor substrate, $Y_2O_3$ as the first tunnel oxide layer 221, $SiO_2$ as the second tunnel oxide layer 222, $Ta_2O_5$ as the storage oxide layer 240, $SiO_2$ as a first block oxide layer 261, and $HfO_2$ as a second block oxide layer 262. FIG. 7a to FIG. 7d illustrate the energy band diagrams during a balance state, a programming operation, a retention mode, and an erasing operation, respectively.

Figure 7A:
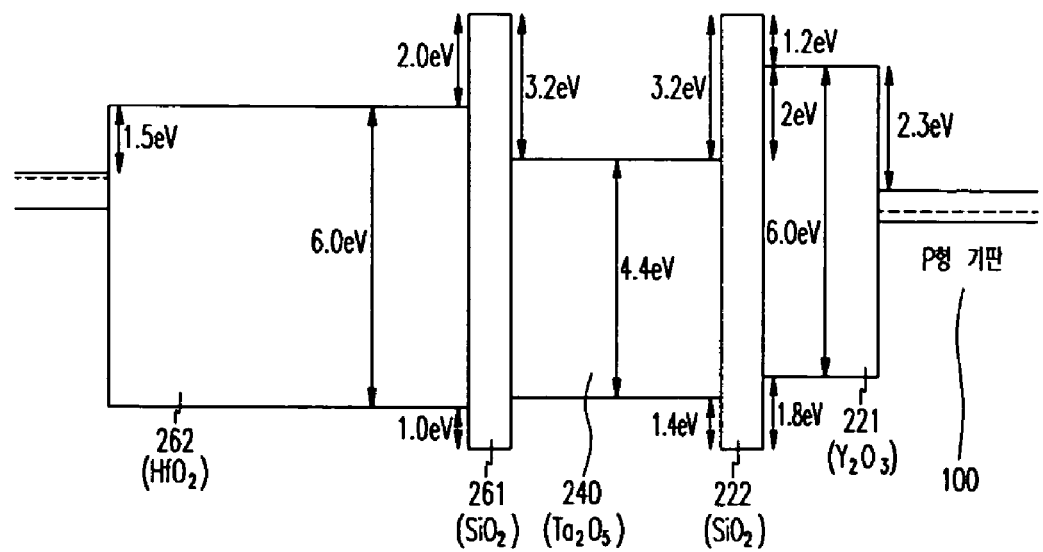
FIG. 7a to FIG. 7d are energy band diagrams of a fourth non-volatile memory device during a balance state, a programming operation, a retention mode, and an erasing operation, respectively.

As shown in FIG. 7a, in the balance state the difference between the energy levels of the conduction bands of the $SiO_2$ used as the second tunnel oxide layer 222 and the $Ta_2O_5$ used as the storage oxide layer 240 becomes 3.2 eV, and the difference between the energy levels of the conduction bands of the $SiO_2$ used as the first block oxide layer 261 and the $Ta_2O_5$ used as the storage oxide layer 240 also becomes 3.2 eV such that an electric charge well is created by the difference of the energy bands.

Figure 7B:
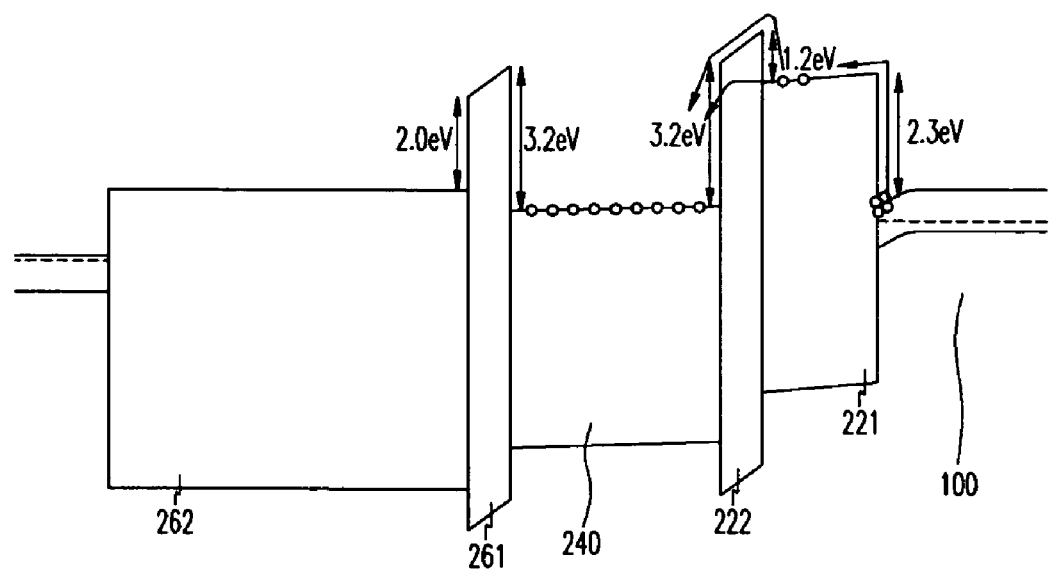

As shown in FIG. 7b, in the programming operation the electric permittivity of $Ta_2O_5$ is 23, which is 5.9 times greater than that of the $SiO_2$, the permittivity of the $Y_2O_3$ used as the first tunnel oxide layer 221 is 17, which is 4.4 times greater than that of the $SiO_2$, and the permittivity of the $HfO_2$ used as the second block oxide layer 262 is 25, which is 6.4 times greater than that of the $SiO_2$, such that it is possible to reduce the thickness of the electric oxide to efficiently reduce the gate voltage.

If a bias is applied to the gate and the drain in the best conditions for injecting hot carriers, the electrons formed on the surface of the P-type substrate are accelerated by the drain electric field sufficiently to obtain energy greater than the electric potential barrier (3.5 eV) of the second tunnel oxide layer ($SiO_2$) 222, such that electrons jump over the electric potential barrier and are injected into the conduction band of the second tunnel oxide layer ($SiO_2$) 222. Some of the injected electrons have sufficient energy to jump over the electric potential barrier (1.2 eV) formed by the first and second tunnel oxide layers 221, 222, and are injected into the electric charge well of the storage oxide layer 240. The remaining electrons are injected into the electric charge well of the storage oxide layer 240 by directly tunneling the shallowly deposited second tunnel oxide layer 222. Since, in the illustrated example, the electric potential barrier of the first and second tunnel oxide layers 221, 222 is lower than the electric potential barrier of a tunnel oxide layer 220 using only $SiO_2$ by as much as 1.2 eV, the hot carrier injection efficiency is improved which increases the programming speed.

In the illustrated example, even though some of the electrons blocked in the electric charge well can be trapped inside the trap site of the storage oxide layer 240, the electrons that are not trapped inside the trap site are trapped inside the electric charge well due to the very low trap density. Accordingly, the increase of the threshold voltage is primarily caused by the electrons trapped in the electric charge well, and the incremental increase of the threshold voltage caused by the electrons trapped inside the trap site can be ignored.

Figure 7C:
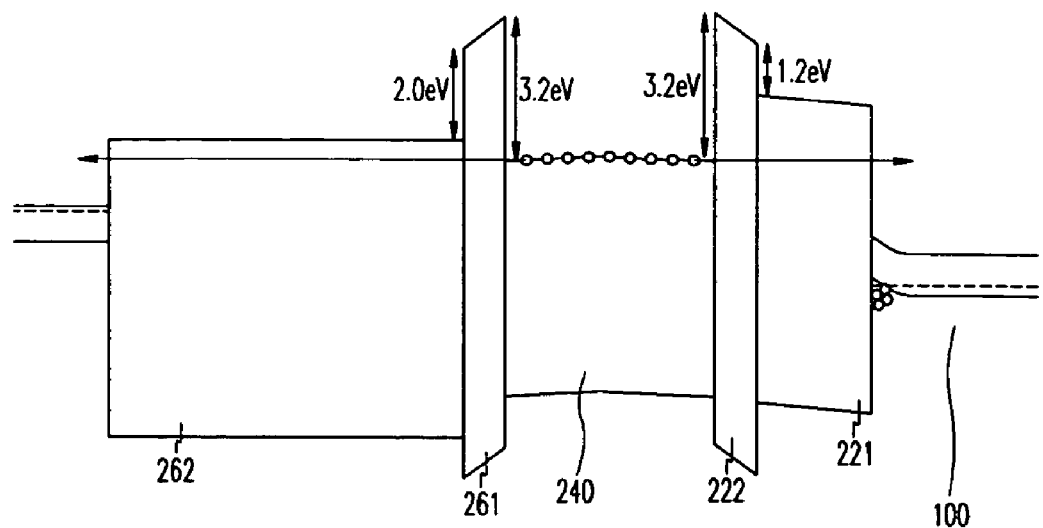

The retention mode will be explained with reference to FIG. 7c. In the illustrated example, since the hot carrier injection technique is used during the programming operation, the programming characteristic does not change even when the thickness of the first tunnel oxide layer ($Y_2O_3$) is increased. Consequently, it is possible to thickly form the tunnel oxide layer as in the floating gate device.

The electrons trapped in the electric charge well of the storage oxide layer form an internal electric field, which may tunnel the tunnel oxide layer 220 or the first and second block oxide layers 261, 262 such that the electrons slip out to the P-type substrate and the gate. This tunneling is inversely proportional to the length of the tunneling in exponential function. Therefore, it is possible to increase the thicknesses of the first tunnel oxide layer 221 and the second block oxide layer 222 to dramatically improve the retention characteristic.

It is noted that the height of the electric potential barrier formed by the first block oxide layer 261 and the storage oxide layer 240 should be higher than the height of the electric potential barrier formed by the first block oxide layer 261 and the second block oxide layer 262. When this condition is met, the whole tunneling length becomes equal to the sum of the thicknesses of the first block oxide layer 261 and the second block oxide layer 262 only when the height of the electric potential barrier formed by the first block oxide layer 261 and the storage oxide layer 240 is higher than the height of the electric potential barrier formed by the first block oxide layer 261 and the second block oxide layer 262.

Similarly, the height of the electric potential barrier formed by the second tunnel oxide layer 222 and the storage oxide layer 240 should be higher than that of the electric potential barrier formed by the first and second tunnel oxide layers 221, 222. This is because the whole tunneling length becomes equal to the sum of the thicknesses of the first tunnel oxide layer 221 and the second tunnel oxide layer 222 only when the electric potential barrier formed by the second tunnel oxide layer 222 and the storage oxide layer 240 is higher that that of the electric potential barrier formed by the first and second tunnel oxide layers 221, 222.

Also, the electric potential barrier between the tunnel oxide layer ($SiO_2$) 222 and the storage oxide layer ($Ta_2O_5$) 240 is 3.2 eV and the electric potential barrier between the first block oxide layer ($SiO_2$) 261 and the storage oxide layer ($Ta_2O_5$) 240 is 3.2 eV such that the electrons cannot jump the high electric potential barrier even in a hot or other environment, thereby resulting in improvement of the retention characteristic.

Figure 7D:
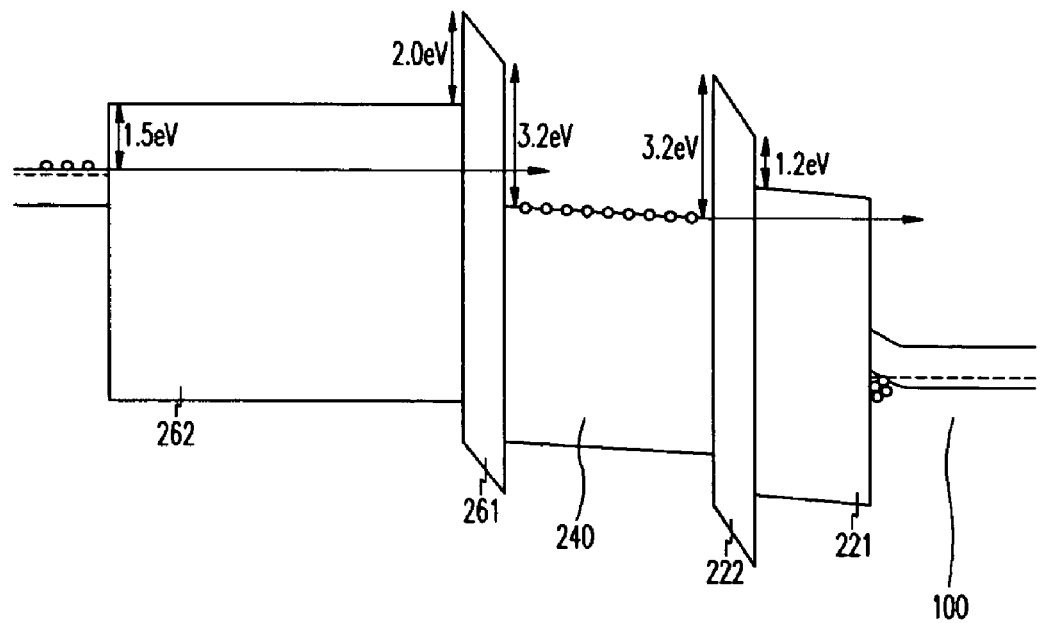

As shown in FIG. 7d, in the erasing procedure the electrons stored in the electric charge well jump out to the P-type substrate through the tunnel oxide layer 221, 222 using the direct tunneling or F-N tunneling technique. Here, since the permittivities of the second block oxide layer 262 and the storage oxide layer 240 are greater than that of the tunnel oxide layer 221, 222, the voltage drop caused by the second block oxide layer 262 and the storage layer 240 may be ignored. Also, the first block oxide layer 261 is thinner than the tunnel oxide layer 221, 222 such that most of the gate voltage is applied to the tunnel oxide layer 221, 222.

In the examples described above, the tunnel oxide layer 220 is made from a material having a high energy bandgap such as $SiO_2$, $Al_2O_3$, or $Y_2O_3$, the storage oxide layer 240 is made from a material such as $HfO_2$, $ZrO_2$, $BaZrO_2$, $BaTi_{O3}$, $Ta_2O_5$, $ZrSiO_4$, or La oxides, the block oxide layer 260 is made from a material having a high energy bandgap such as $SiO_2$, $Al_2O_3$, or $Y_2O_3$. As a result, an electric potential barrier is created in the storage oxide layer 240 which is almost identical with the barrier of a conventional floating gate. It is, therefore, possible to achieve improved programming speed using the hot carrier injection technique, to obtain a wide threshold voltage window, to easily implement multi-level bit, and to increase the thickness of the tunnel oxide layer, thereby resulting in an improved retention characteristic. Furthermore, the illustrated non-volatile memory devices may be fabricated by sequentially depositing the tunnel oxide layer(s) 220, the storage oxide layer 240, and the block oxide layer(s) 260, and then etching through a single patterning/etching process as in the SONOS device fabrication process such that it is easy to embed in a conventional device fabrication process and possible to scale identical with the logic device.

In the illustrated examples, the electrons are blocked in the electric charge well formed within the storage oxide layer 240 using the hot carrier injection technique such that programming is carried out at a fast speed regardless of the thickness of the tunnel oxide layer 220.

Also, since the programming speed is not affected by the thickness of the tunnel oxide layer 220, it is possible to dramatically improve the retention characteristic by increasing the thickness of the tunnel oxide layer 220.

Also, the electric charge well of the storage oxide layer 240 is formed such that its electric potential barrier is approximately identical with the electric potential barrier of the floating gate device Also, since the illustrated non-volatile memory devices are fabricated in a single patterning/etching process after sequentially depositing the tunnel oxide layer(s) 220, the storage oxide layer 240, the block oxide layer(s) 260, and the polycrystalline silicon, the fabrication process is very simple and easy to embed within a conventional logic device fabrication process.

Also, since no charge loss is caused due to coupling with peripheral devices, it is possible to scale the illustrated devices to be identical with the logic device.

Also, if the tunnel oxide layer 220 is formed as a two layered structure, the first tunnel oxide layer 221 is preferably formed out of a material having an energy bandgap which is lower than the energy bandgap of $SiO_2$ so as to increase the hot carrier injection efficiency and, thus, increasing the programming speed. Furthermore, since the second tunnel oxide layer 222 is formed out of a material having a high energy bandgap, the electric charge well is formed deeply within the storage oxide layer 240, and it is possible to prevent the retention characteristic from being deteriorated.

Also, if the block oxide layer 260 is implemented as a two layered structure, the first block oxide layer 261 is preferably thinly deposited with a material having a large energy bandgap so that a high electric potential barrier is formed between the block oxide layer 260 and the storage oxide layer 240. Further, the second block oxide layer 262 is preferably thickly deposited with a material having a high energy bandgap, such that it is possible to prevent the electrons stored in the electric charge well from being tunneled into the gate irrespective of the electric field induced in the tunnel oxide layer 220 during the programming and erasing operations, or to efficiently prevent the electrons existing in the gate from being tunneled into the electric charge well of the storage oxide layer 240, thereby improving the retention characteristic.

Also, if both the block oxide layer 260 and the tunnel oxide layer 220 are formed as two layered structures, the dielectric permittivity of the second block oxide layer 262 and the first tunnel oxide layer 222 are preferably so large that it is possible to maintain the thickness of the storage oxide layer 240 in an approximate identical thickness even when the thickness of the block oxide layer 260 and/or the thickness of the tunneling oxide layer 220 increases.

From the foregoing, persons of ordinary skill in the art will readily appreciate that non-volatile memory devices having the advantages of both the floating gate device and the SONOS device have been disclosed.

Persons of ordinary skill in the art will also appreciate that the disclosed non-volatile memory devices are capable of being simply fabricated, have a scaling performance which is identical with a logic device, and have excellent retention characteristics.

An example non-volatile memory device includes a tunnel oxide layer 220 formed on a semiconductor substrate 100, a storage oxide layer 240 formed on the tunnel oxide layer 220, the storage oxide layer 240 having an energy bandgap which is smaller than of the energy bandgap of the tunnel oxide layer 220, a block oxide layer 260 formed on the storage oxide layer 240, the block oxide layer 260 having an energy bandgap which is greater than that of the storage oxide layer 240, and a gate formed on the block oxide layer 260.

The tunnel oxide layer 220 and the block oxide layer 260 have respective conduction bands that are greater than a conduction band of the storage oxide layer 240, such that an electric potential barrier between the tunnel oxide layer 220 and the storage layer 240, and an electric potential barrier between the block oxide layer 260 and the storage layer 240 define an electric charge well.

During a programming operation, electrons flow from the semiconductor substrate 100 over the electric potential barrier between the semiconductor substrate 100 and the tunnel oxide layer 220 and are stored within the electric charge well by a hot carrier injection technique. During an erasing operation, electrons tunnel through the tunnel oxide layer 220 to flow from the electric charge well to the semiconductor substrate by a direct tunneling or an F-N tunneling technique.

Preferably, the tunnel oxide layer 220 is formed out of any of $SiO_2$, $Al_2O_3$, and/or $Y_2O_3$.

Preferably, the storage oxide layer 240 is formed out of any of $HfO_2$, $ZrO_2$, $BaZrO_2$, $BaTiO_3$, $Ta_2O_5$, CaO, SrO, BaO, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, and/or $Lu_2O_3$.

Preferably, the block oxide layer 260 is formed out of any of $SiO_2$, $Al_2O_3$, and/or $Y_2O_3$.

Preferably, the tunnel oxide layer 220 is formed at a thickness in the range of about 30–150 Å, the storage oxide layer 240 is formed at a thickness in the range of about 40–500 Å, the block oxide layer 260 is formed at a thickness in the range of about 40–200 Å.

Preferably, the tunnel oxide layer 220 includes a first tunnel oxide layer 221 formed on the semiconductor substrate 100 and a second tunnel oxide layer 222 formed on the first tunnel oxide layer 220. Preferably, the first tunnel oxide layer 221 has an energy bandgap greater than that of the storage oxide layer 240 and less than that of the second tunnel oxide layer 222.

Preferably, the first tunnel oxide layer 221 is formed thicker than the second tunnel oxide layer 222.

Preferably, the first tunnel oxide layer 221 is formed at a thickness in the range of about 30–150 Å and the second tunnel oxide layer 222 is formed at a thickness in the range of about 5–40 Å.

Preferably, the first tunnel oxide layer 221 is formed out of any of $HfO_2$, $ZrO_2$, $BaZrO_2$, $BaTiO_3$, $Ta_2O_5$, CaO, SrO, BaO, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, and/or $Lu_2O_3$.

Preferably, the second tunnel oxide layer 222 is formed out of any of $SiO_2$, $Al_2O_3$, and/or $Y_2O_3$.

Preferably, an electric potential barrier formed between the second tunnel oxide layer 261 and the storage oxide layer 240 is greater than the electric potential barrier formed between the first and second tunnel oxide layers 261, 262.

If the tunnel oxide layer 220 is formed as a two layered structure, during the programming operation the electrons jump the electric potential barrier between the semiconductor substrate 100 and the first tunnel oxide 221 so as to flow from the semiconductor substrate 100 and then jump the electric potential barrier between the first and second tunnel oxide layers 221, 222 or tunnel the second tunnel oxide layer 222 so as to be stored within the electric charge well, using hot carrier injection. During an erasing operation, the electrons tunnel the first and second tunnel oxide layers 221. 222 so as to move from the electric charge well to the semiconductor substrate using direct tunneling or F-N tunneling.

Preferably, the block oxide layer 260 includes a first block oxide layer 261 formed on the storage oxide layer 240 and a second block oxide layer 262 formed on the first block oxide layer 261. Preferably, the second block oxide layer 262 has an energy bandgap greater than that of the storage oxide layer 240 and less than that of the first block oxide layer 261.

Preferably, the second block oxide layer 262 is formed thicker than the first block oxide layer 261.

The first block oxide layer 261 is formed at a thickness in the range of about 10–50 Å and the second block oxide layer 262 is formed at a thickness in the range of about 40–200 Å.

Preferably, the first block oxide layer 261 is formed out of any of $SiO_2$, $Al_2O_3$, and/or $Y_2O_3$.

Preferably, the second block oxide layer 262 is formed out of any of $HfO_2$, $ZrO_2$, $BaZrO_2$, $BaTiO_3$, $Ta_2O_5$, CaO, SrO, BaO, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, and/or $Lu_2O_3$.

Preferably, the electric potential barrier between the first block oxide layer 261 and the storage layer 240 is greater than the electric potential barrier between the first and second block oxide layers 261, 262.

A method for fabricating a non-volatile memory device includes forming a tunnel oxide layer 220 on a semiconductor substrate 100, and forming a storage oxide layer 240 on the tunnel oxide layer 200. The storage oxide layer 240 has an energy bandgap less than that of the tunnel oxide layer 220. The method also includes forming a block oxide layer 260 on the storage oxide layer240. The block oxide layer 260 has an energy bandgap greater than that of the storage oxide layer 240. The method also includes forming a gate on the block oxide layer 260, and, selectively etching the gate, the block oxide layer 260, the storage oxide layer 240, and the tunnel oxide layer 220 in a predetermined width.

Preferably, the tunnel oxide layer 220, the storage oxide layer 240, and the block oxide layer 260 are formed using one or more of a spreading, a chemical vapor deposition, and/or an oxidation-after-metal deposition technique.

It is noted that this patent claims priority from Korean Patent Application Serial Number 10-2003-0077923, which was filed on Nov. 5, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A non-volatile memory device comprising:
a tunnel oxide layer comprising a first tunnel oxide layer on a semiconductor substrate and a second tunnel oxide layer on the first tunnel oxide layer, the first tunnel oxide layer having an energy bandgap less than an energy bandgap of the second tunnel oxide layer,
a storage oxide layer on the tunnel oxide layer, the storage oxide layer having an energy bandgap which is smaller than the energy bandgap of the first tunnel oxide layer;
a block oxide layer on the storage oxide layer, the block oxide layer having an energy bandgap greater than the energy bandgap of the storage oxide layer, and
a gate on the block oxide layer.

2. A non-volatile memory device as defined in claim 1, wherein each of the tunnel oxide layer and the block oxide layer has a conduction band, and the conduction bands of the tunnel oxide layer and the block oxide layer are greater than a conduction band of the storage oxide layer, such that an electric potential barrier between the tunnel oxide layer and the storage oxide layer and an electric potential barrier between the block oxide layer and the storage layer define an electric charge well.

3. A non-volatile memory device as defined in claim 2, wherein electrons flow from the semiconductor substrate over the electric potential barrier between the semiconductor substrate and the tunnel oxide layer and are stored within the electric charge well by a hot carrier injection technique during a programming operation.

4. A non-volatile memory device as defined in claim 2, wherein electrons tunnel through the tunnel oxide layer to flow from the electric charge well to the semiconductor substrate by a direct tunneling or an F-N tunneling technique during an erasing operation.

5. A non-volatile memory device as defined in claim 1, wherein the tunnel oxide layer comprises one or more of $SiO_2$, $Al_2O_3$, or $Y_2O_3$.

6. A non-volatile memory device as defined in claim 1, wherein the storage oxide layer comprises one or more of $HfO_2$, $ZrO_2$, $BaZrO_2$, $BaTiO_3$, $Ta_2O_5$, $CaO$, $SrO$, $BaO$, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, or $Lu_2O_3$.

7. A non-volatile memory device as defined in claim 1, wherein the block oxide layer comprises one or more of $SiO_2$, $Al_2O_3$, or $Y_2O_3$.

8. A non-volatile memory device as defined in claim 1, wherein the tunnel oxide layer has a thickness in a range of about 30–150 Å.

9. A non-volatile memory device as defined in claim 1, wherein the storage oxide layer has a thickness in a range of about 40–500 Å.

10. A non-volatile memory device as defined in claim 1, wherein the block oxide layer has a thickness in a range of about 40–200 Å.

11. A non-volatile memory device as defined in claim 1, wherein the first tunnel oxide layer is thicker than the second tunnel oxide layer.

12. A non-volatile memory device as defined in claim 11, wherein the first tunnel oxide layer has a thickness in a range of about 30–150 Å.

13. A non-volatile memory device as defined in claim 11, wherein the second tunnel oxide layer has a thickness in a range of about 5–40 Å.

14. A non-volatile memory device as defined in claim 11, wherein the first tunnel oxide layer comprises one or more of $HfO_2$, $ZrO_2$, $BaZrO_2$, $BaTiO_3$, $Ta_2O_5$, $CaO$, $SrO$, $BaO$, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, or $Lu_2O_3$.

15. A non-volatile memory device as defined in claim 11, wherein the second tunnel oxide layer comprises one or more of $SiO_2$, $Al_2O_3$, or $Y_2O_3$.

16. A non-volatile memory device as defined in claim 1, wherein an electric potential barrier between the second tunnel oxide layer and the storage oxide layer is greater than an electric potential barrier formed between the first and second tunnel oxide layers.

17. A non-volatile memory device as defined in claim 11, wherein each of the second tunnel oxide layer and the block oxide layer has a conduction band, and the conduction bands of the second tunnel oxide layer and the block oxide layer are higher than a conduction band of the storage oxide layer, such that an electric potential barrier between the first tunnel oxide layer and the storage oxide layer and an electric potential barrier between the block oxide layer and the storage oxide layer define an electric charge well.

18. A non-volatile memory device as defined in claim 1, wherein the block oxide layer includes a first block oxide layer on the storage oxide layer and a second block oxide layer on the first block oxide layer, the second block oxide layer having an energy bandgap greater than the energy bandgap of the storage oxide layer and less than the energy bandgap of the first block oxide layer.

19. A non-volatile memory device as defined in claim 18, wherein the second block oxide layer is thicker than the first block oxide layer.

20. A non-volatile memory device as defined in claim 18, wherein the first block oxide layer has a thickness in a range of about 10–50 Å.

21. A non-volatile memory device as defined in claim 18, wherein the second block oxide layer has thickness in a range of about 40–200 Å.

22. A non-volatile memory device as defined in claim 18, wherein the first block oxide layer comprises one or more of $SiO_2$, $Al_2O_3$, or $Y_2O_3$.

23. A non-volatile memory device as defined in claim 18, wherein the second block oxide layer comprises one or more of $HfO_2$, $ZrO_2$, $BaZrO_2$, $BaTiO_3$, $Ta_2O_5$, $CaO$, $SrO$, $BaO$, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, or $Lu_2O_3$.

24. A non-volatile memory device as defined in claim 18, wherein an electric potential barrier between the first block oxide layer and the storage layer is greater than an electric potential barrier between the first and second block oxide layers.

25. A non-volatile memory device as defined in claim 18, wherein conduction bands of the tunnel oxide layer and the first block oxide layer are greater than a conduction band of the storage oxide layer such that an electric charge well is defined by electric potential barriers formed between the tunnel oxide layer and the storage oxide layer and between the first block oxide layer and the storage oxide layer.

* * * * *